(12) United States Patent
Wu

(10) Patent No.: US 10,637,348 B1
(45) Date of Patent: Apr. 28, 2020

(54) DEAD-TIME CONTROL FOR HALF-BRIDGE DRIVER CIRCUIT

(71) Applicant: Diodes Incorporated, Plano, TX (US)

(72) Inventor: Wei Wu, Fremont, CA (US)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 16/436,409

(22) Filed: Jun. 10, 2019

(51) Int. Cl.
| | | |
|---|---|---|
| *H03F 3/217* | (2006.01) | |
| *H02M 3/158* | (2006.01) | |
| *H03K 3/013* | (2006.01) | |
| *H02M 1/38* | (2007.01) | |
| *H02M 1/08* | (2006.01) | |
| *H03K 17/687* | (2006.01) | |

(52) U.S. Cl.
CPC .............. *H02M 1/38* (2013.01); *H02M 1/08* (2013.01); *H03K 17/6871* (2013.01); *H03K 2217/0063* (2013.01); *H03K 2217/0072* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,804,360 B2* | 9/2010 | Chiu | ..................... | H03F 3/2171 330/207 A |
| 10,097,082 B1* | 10/2018 | Turchi | ................... | H02M 3/156 |
| 10,348,293 B2* | 7/2019 | Abesingha | ........... | H03K 17/284 |
| 2013/0194003 A1* | 8/2013 | Takayama | .......... | H03K 19/0013 326/83 |

* cited by examiner

*Primary Examiner* — An T Luu

(57) ABSTRACT

A gate driver circuit includes an input terminal for receiving an input switching signal for driving a switching circuit that has a high-side transistor and a low-side transistor vertically stacked. The gate driver circuit also includes a dead-time control circuit, that includes two dead-time measurement circuits. The first dead-time measurement circuit produces a first pulse signal having a first pulse width representing a first dead-time between when a gate voltage of the low-side transistor falls below a first threshold voltage and when a gate voltage of the high-side transistor rises above a second threshold voltage. The second dead-time measurement circuit produces a second pulse signal having a second pulse width representing a second dead-time between when the gate voltage of the high-side transistor falls below the second threshold voltage and when the gate voltage of the low-side transistor rises above the second threshold voltage.

20 Claims, 15 Drawing Sheets

DEAD-TIME CONTROL FOR HALF-BRIDGE DRIVER CIRCUIT

BACKGROUND OF THE INVENTION

The present invention relates generally to electronic circuit design. More particularly, the present invention relates to driver circuits for a switching circuit having two transistors in a half-bridge configuration.

A half-bridge circuit has two transistors stacked vertically between a power terminal and a ground terminal. The half-bridge configuration can be used for a variety of applications such as DC-DC converters, DC-AC converters AC-DC power supplies, motor controls Class-D power amplifiers etc. A half-bridge configuration in a power converter often has a high-side N-channel MOSFET and a low-side N-channel MOSFET connected at a common node. If both of the N-channel MOSFETs are turned on simultaneously, a shoot-through current will flow from supply to ground, which may be large enough to damage the MOSFETS. Therefore, a delay time is usually introduced after the first MOSFET is turned off and before the second MOSFET is turned on. This time period is known as the dead-time, during which neither the high-side MOSFET nor the low-side MOSFET is turned on. However, if the dead-time is too long, it can degrade the power efficiency, and it can also introduce a large reverse recovery current that also degrades the performance of the circuit. Therefore, it is desirable to optimize the dead-time control under a wide range of process, voltage and temperature variation.

Conventional dead-time control techniques have been proposed. In a first method, a fixed dead-time is inserted to cause a fixed delay between the turn-off of one transistor and the turn-on of the second transistor. Another dead-time control method uses two separate comparators to continuously compare the gate voltages of both transistors to two predetermined voltages, and a control unit uses the results from the comparators to adjust the dead-time.

However, these conventional dead-time control methods suffer from many limitations. More details of these and other limitations are described below.

BRIEF SUMMARY OF THE INVENTION

The inventor has recognized that conventional dead-time control methods are not satisfactory. For example, the fixed dead-time approach is likely to result in too long a dead-time. The conventional adaptive dead-time detection method requires two separate comparators and additional logic circuits in the control circuit to adjust the dead-time. The conventional circuits tend to have slower response time, resulting in loss of accuracy and resolution, and limiting the extent to which the dead-time can be reduced.

This invention teaches a gate driver circuit having a dead-time measurement circuit that produces a dead-time pulse signal with a pulse width representing the dead-time between a first time instance when a falling signal falls below the first reference voltage and a second time instance when a rising signal rises above the second reference voltage. In an example, the dead-time measurement circuit is a fast circuit that integrates two differential pairs to simultaneously monitor the falling signal and the rising signal, and provides a pulse signal having a pulse width that can accurately measure the dead-time with a duration as low as a nanosecond or less. The gate driver circuit continuously monitors and reduces the dead-time, as long as the dead-time pulse signal has a duration that triggers a detection flip-flop.

As a result, the gate driver circuit can adaptively reduce the dead-time to a nanosecond or less. The gate driver circuit also can also increase the dead-time to prevent shoot-through current if no dead-time pulse is detected.

For example, an exemplary gate driver circuit includes an input terminal for receiving an input switching signal for driving a switching circuit that has a high-side transistor and a low-side transistor vertically stacked, a first output terminal for providing a first output signal for driving the high-side transistor, and a second output terminal for providing a second output signal for driving the low-side transistor. The gate driver circuit also includes a dead-time control circuit, that includes two dead-time measurement circuits. The first dead-time measurement circuit produces a first pulse signal having a first pulse width representing a first dead-time between a first time instance when a gate voltage of the low-side transistor falls below a first threshold voltage and a second time instance when a gate voltage of the high-side transistor rises above a second threshold voltage. The second dead-time measurement circuit produces a second pulse signal having a second pulse width representing a second dead-time between a third time instance when the gate voltage of the high-side transistor falls below the second threshold voltage and a fourth time instance when the gate voltage of the low-side transistor rises above the first threshold voltage. The dead-time control circuit provides a first gate control signal and a second gate control signal based on the input switching signal and the first and second pulse signals. Further, an output driver circuit generates the first output signal based on the first gate control signal and the second output signal based on the second gate control signal.

In the above gate driver circuit, each of the first and second dead-time measurement circuits includes a first input terminal for receiving a rising input signal, a second input terminal for receiving a falling input signal, a first reference terminal for receiving a first reference voltage, and a second reference terminal for receiving a second reference voltage. Each of the first and second dead-time measurement circuits produces a pulse signal with a pulse width representing a dead-time between a first time instance when the falling input signal falls below the first reference voltage and a second time instance when the rising input signal rises above the second reference voltage.

Each of the first and second dead-time measurement circuits includes two differential pairs. The first differential pair includes first and second transistors. The first transistor is coupled to the first input terminal RISE for receiving the rising input signal, and the second transistor coupled to the first reference terminal for receiving the first reference voltage. The first differential pair also has an output node at a drain node of the first transistor. The second differential pair has third and fourth transistors. The third transistor is coupled to the second input terminal FALL for receiving the falling input signal, and the fourth transistor is coupled to the second reference terminal for receiving a second reference voltage. A common source node of the second differential pair is coupled with the output node of the first differential pair. The second differential pair has an output node at a drain node of the third transistor.

In the above gate driver circuit, the dead-time control circuit also has a delay circuit that provides a first delay count related to the first dead-time and a second delay count related to the second dead-time. At every cycle of the input switching signal, the delay circuit decrements the first delay count if the first pulse signal is detected, and increments the first delay count if the first pulse signal is not detected.

Similarly, the delay circuit decrements the second delay count if the second pulse signal is detected, and increments the second delay count if the second pulse signal is not detected. The delay circuit provides first and second gate control signals based on the input switching signal and the first and second delay counts.

The delay circuit includes a first flip-flop for providing a first trigger signal in response to the first pulse signal. The first trigger signal causes a first delay counter circuit to increment or decrement a first delay count. The delay circuit also includes a second flip-flop for providing a second trigger signal in response to the second pulse signal. The second trigger signal causes a second delay counter circuit to increment or decrement a second delay count.

Definitions

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A half-bridge circuit as used herein refers to a switching circuit having a high-side transistor and a low-side transistor vertically stacked and connected at a midpoint.

A dead-time as used herein refers to the time during which both the a high-side transistor and a low-side transistor in a half-bridge switching circuit are turned off.

A differential pair as used herein refers to a circuit that amplifies the difference between two input voltages, but suppresses any voltage common to the two inputs. A differential pair can be implemented as a two-transistor circuit.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called double-diffused MOS or simply DMOS.

An insulated-gate bipolar transistor (IGBT) as used herein refers to a three-terminal power semiconductor device primarily used as an electronic switch which combines high efficiency and fast switching.

A power converter is an electrical or electro-mechanical device for converting electrical energy, such as converting between AC and DC or changing the voltage, current, or frequency, or some combinations of these conversions. A power converter often includes voltage regulation.

A switching regulator, or switch mode power supply (SMPS), uses an active device that switches on and off to maintain an average value of output. In contrast, a linear regulator is made to act like a variable resistor, continuously adjusting a voltage divider network to maintain a constant output voltage, and continually dissipating power.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

When the term "the same" is used to describe two quantities, it means that the values of two quantities are determined the same within measurement limitations.

DETAILED DESCRIPTION OF THE INVENTION

Figure 1:
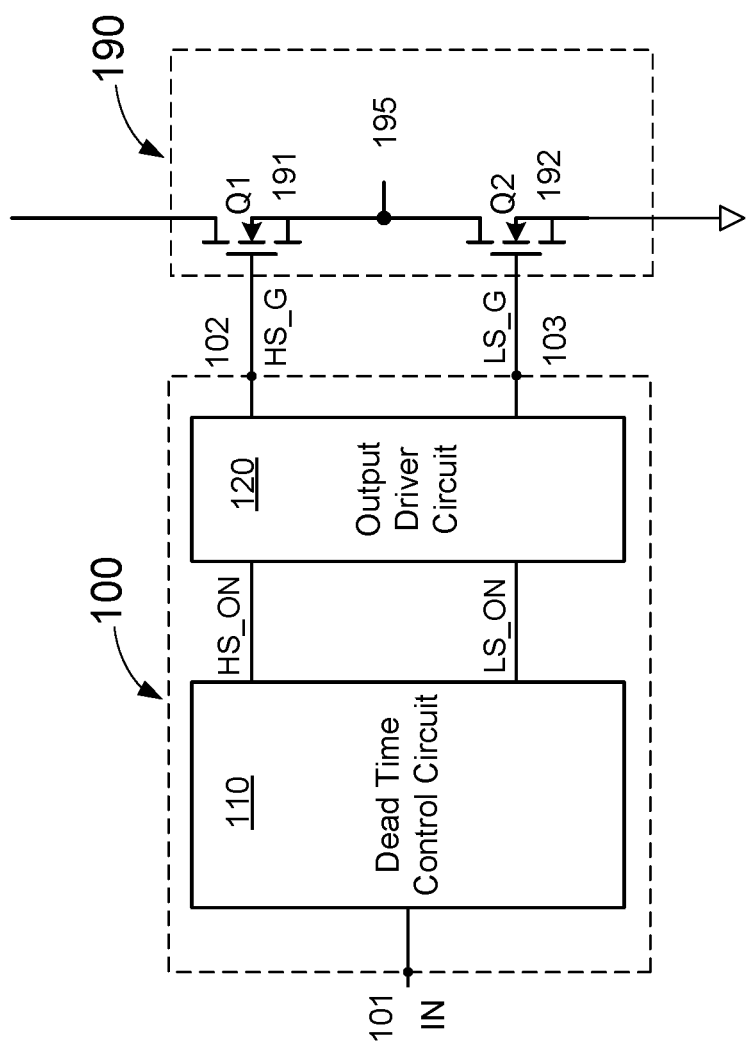
FIG. 1 is a simplified block diagram illustrating a gate driver circuit that embodies certain aspects of this invention.

FIG. 1 is a simplified block diagram illustrating a gate driver circuit that embodies certain aspects of this invention. As shown in FIG. 1, a gate driver circuit 100 includes an input terminal 101 for receiving an input switching signal IN for driving a switching half-bridge circuit 190 that has a high-side transistor 191 (Q1) and a low-side transistor 192 (Q2) vertically stacked and connected at a midpoint 195. The midpoint 195 provides an output for the switching half-bridge circuit. Gate driver circuit 100 also includes a first output terminal 102 for providing a first output signal HS_G for driving the high-side transistor Q1 and a second output terminal 103 for providing a second output signal LS_G for driving the low-side transistor Q2. Gate driver circuit 100 also includes a dead-time control circuit 110 and an output driver circuit 120. Dead-time control circuit 110 produces a first pulse signal having a first pulse width representing a first dead-time between the time the low-side transistor turns off and the time the high-side transistor turns on. Dead-time control circuit 110 also produces a second pulse signal having a second pulse width representing a second dead-time between the time the high-side transistor turns off and the time the low-side transistor turns on. Dead-time control circuit provides a first gate control signal HS_ON and a second gate control signal LS_ON based on the input switching signal IN and the first and second pulse signals. Output driver circuit 120 generates the first output signal HS_G based on the first gate control signal HS_ON, and the second output signal LS_G based on the second gate control signal LS_ON.

Figure 2:
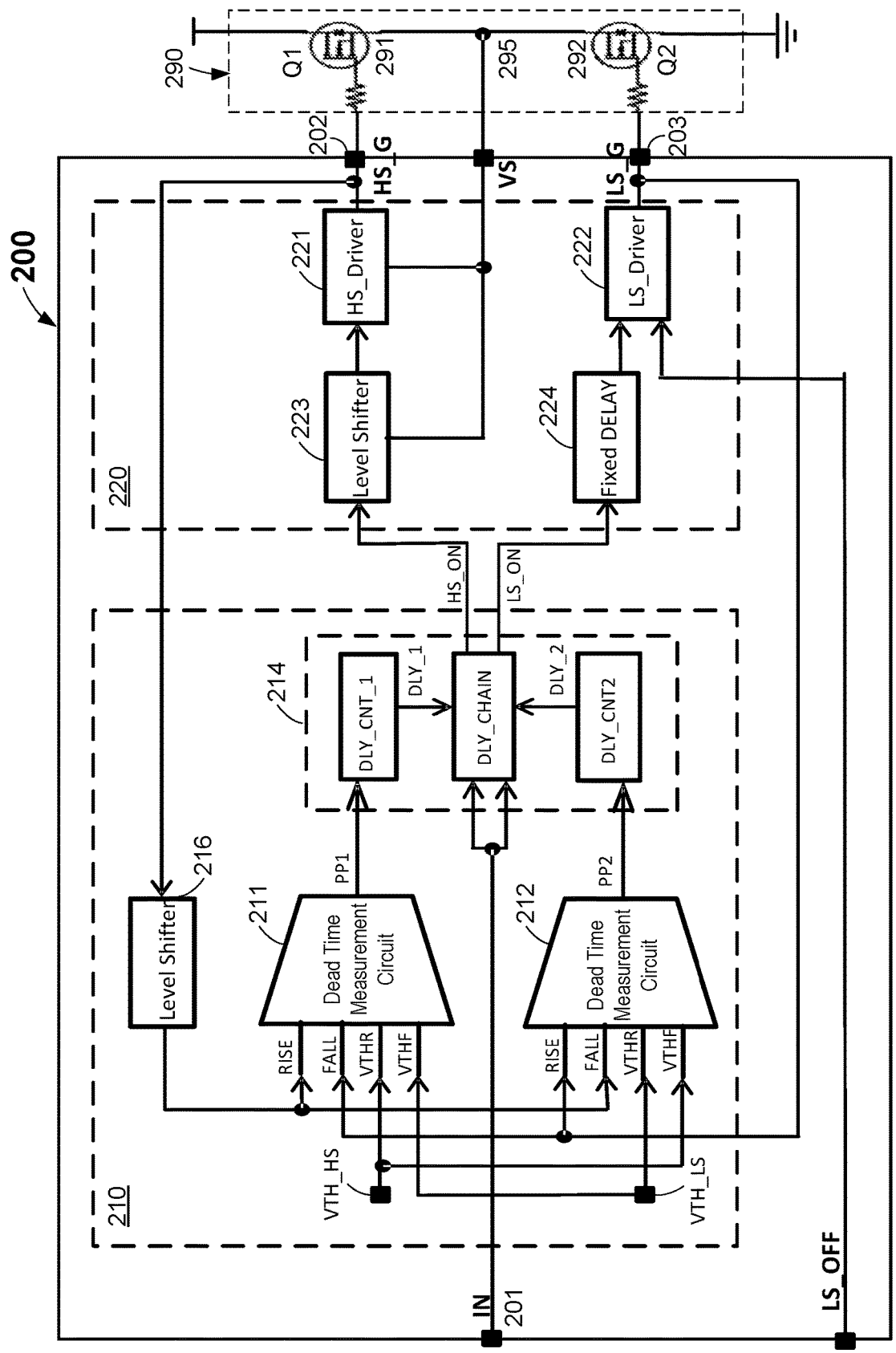
FIG. 2 is a simplified block diagram illustrating another gate driver circuit that embodies certain aspects of this invention.

FIG. 2 is a simplified block diagram illustrating another gate driver circuit that embodies certain aspects of this invention. As shown in FIG. 2, a gate driver circuit 200 includes an input terminal 201 for receiving an input switching signal IN for driving a switching half-bridge circuit 290 that has a high-side transistor 291 (Q1) and a low-side transistor 292 (Q2) connected at a midpoint 295. The midpoint 295 provides an output for switching half-bridge circuit 290. Gate driver circuit 200 also includes a first output terminal 202 for providing a first output signal HS_G for driving the high-side transistor Q1 and a second output terminal 203 for providing a second output signal LS_G for driving the low-side transistor Q2. Gate driver circuit 200 also includes a dead-time control circuit 210 and an output driver circuit 220.

In FIG. 2, dead-time control circuit 210 includes a first dead-time measurement circuit 211 that produces a first pulse signal PP1 having a first pulse width representing a first dead-time between a first time instance when a gate voltage of the low-side transistor Q2 (which is determined by signal LS_G) falls below a first threshold voltage VTH_LS and a second time instance when a gate voltage of the high-side transistor Q1 (which is determined by signal HS_G) rises above a second threshold voltage VTH_HS. Dead-time control circuit 200 also includes a second dead-time measurement circuit 212 that produces a second pulse signal PP2 having a second pulse width representing a second dead-time between a third time instance when the gate voltage HS_G of the high-side transistor Q1 falls below the second threshold VTH_HS voltage and a fourth time instance when the gate voltage LS_G of the low-side transistor Q2 rises above the first threshold voltage VTH_LS.

Dead-time control circuit 210 also includes a delay circuit 214 that has a first delay counter circuit DLY_CNT_1 and a second delay counter circuit DLY_CNT_2 and provides a first delay count DLY_1 related to the first dead-time PP1 and a second delay count DLY_2 related to the second dead-time PP1. At every cycle of the input switching signal IN, delay circuit 214 decrements the first delay count DLY_1 if the first pulse signal PP1 is detected, and increments the first delay count DLY_1 if the first pulse signal PP1 is not detected. Further, delay circuit 214 decrements the second delay count DLY_2 if the second pulse signal PP2 is detected, and increments the second delay count DLY_2 if the second pulse signal PP2 is not detected. Delay circuit 214 also has a delay chain circuit DLY_CHAN for receiving the first delay count DLY_1 and the second delay count DLY_2 and providing a first gate control signal HS_ON and a second gate control signal LS_On based on the input switching signal IN and the first and second delay counts, DLY_1 and DLY_2.

In a half-bridge configuration, the gate voltage HS_G of high-side transistor Q1 is a high-voltage signal. Therefore, a level-shifter 216 is provided between HS_G and the dead-time measurement circuits 211 and 212. In half-bridge configurations, such as for a power converter or a switch mode power supply (SMPS), transistors Q1 and Q2 can be power switches, such as MOSFETs or IGBTs (insulated-gate bipolar transistors).

As shown in FIG. 2, output driver circuit 220 includes a high-side driver 221 (HS_Driver) and a low-side driver 222 (LS_Driver). Output driver circuit 220 can also include other supporting circuitry, such as a level shifter circuit 223 and a fixed delay circuit 224. Output driver circuit 220 generates the first output signal HS_G based on the first gate control signal HS_ON and the second output signal LS_G based on the second gate control signal LS_ON.

Figure 3:
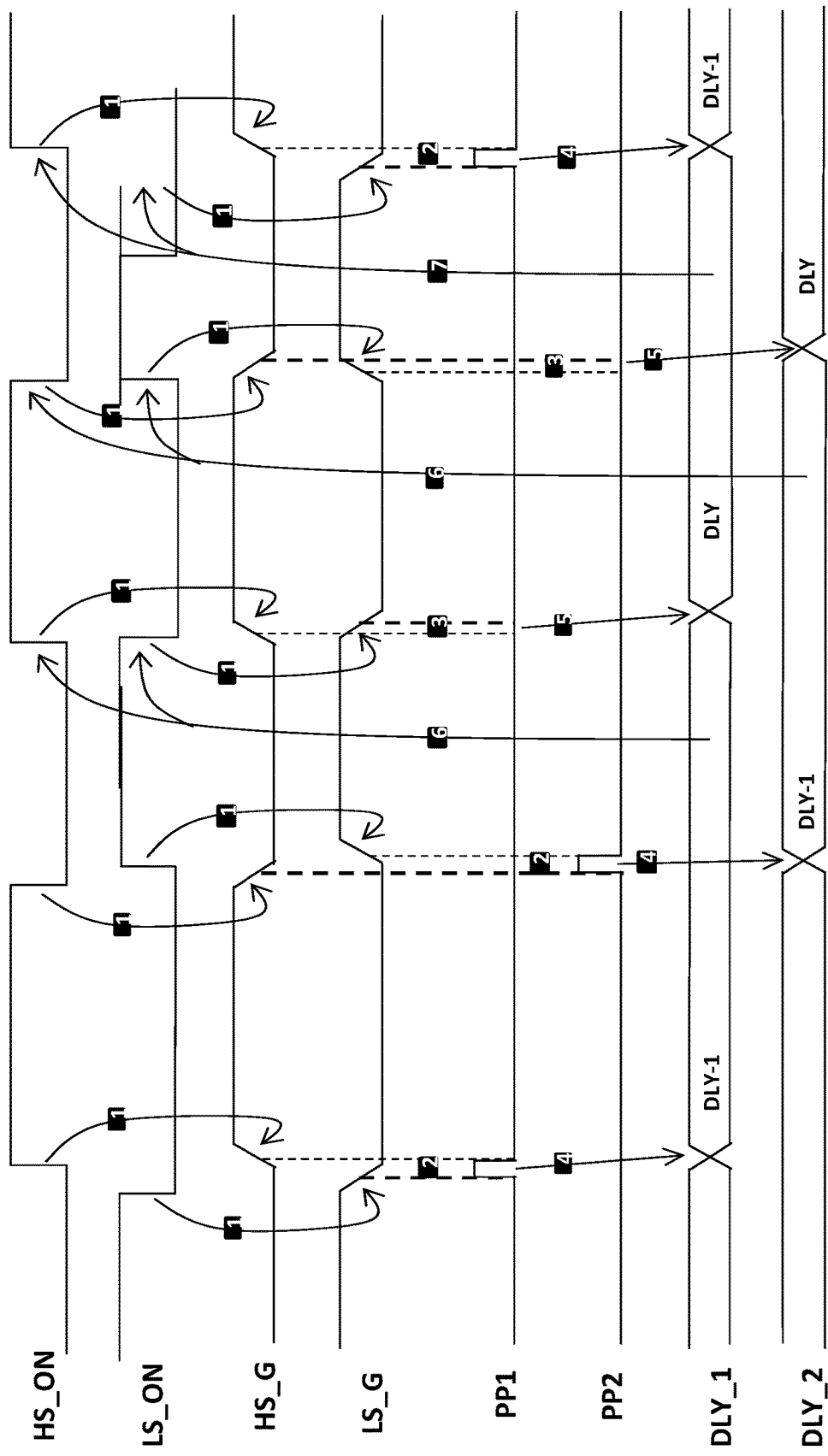
FIG. 3 is a timing diagram that illustrates the operation of the gate driver circuit of FIG. 2 that embodies certain aspects of this invention.

FIG. 3 is a timing diagram that illustrates the operation of the gate driver circuit of FIG. 2 that embodies certain aspects of this invention. The operation of the gate driver circuit 200 is described below with reference to the components illustrated in FIG. 2.

As described above, the gates of High-Side/Low-Side MOSFETs Q1 and Q2 are driven by high-side/low-side driver 221 and 222. In FIG. 3, waveforms HS_ON and LS_ON are the driver inputs, and HS_G and LS_G are the driver outputs. The relationship between HS_ON/LS_ON and HS_G/LS_G are illustrated with labels "1" in FIG. 3. The rising/falling times of HS_G/LS_G depend on the gate capacitance of the MOSFETs as well as series resistors, which can be several ten to hundred nanoseconds or even in microseconds. Transitions of HS_ON and LS_ON are controlled by two programmable delay chains in the delay circuit 214 in FIG. 2. These two programmable delay chains provide delay times, one of which is based on the transition from LS_ON falling edge to HS_ON rising edge, and the other is based on transition from HS_ON falling edge to LS_ON rising.

The high-side or low-side transistor is considered to be OFF if its gate voltage falling edge passes its threshold voltage, and ON if its rising edge passes its threshold voltage. The pulse signal PP1 represents a dead-time after Low-side MOSFET is off and before High-side MOSFET turns on. The pulse signal PP2 represents a dead-time after High-side MOSFET is off and before Low-side MOSFET turns on. The relationship between PP1 and PP2 and HS_G/LS_G are illustrated with labels "2" in FIG. 3.

As illustrated with labels "3" in FIG. 3, if either High-side or Low-side MOSFET is turned on when the other is not off yet, it can be considered as a negative dead-time. This condition is to be avoided because it can lead to a shoot-through current. Under these conditions, no pulse is generated on PP1 or PP2.

As illustrated with label "4" in FIG. 3, when there is a pulse generated for PP1 or PP2 at the transitions of LS_G/HS_G, indicating a finite dead-time, delay counts DLY_1 or DLY_2 is decreased by 1-step of delay time to reduce the dead-time. In the waveforms DLY_1 and DLY_2, DLY is the delay data stored in the counter, and DLY-1 is the data when the counter is decreased by one from DLY. Either LS_ON falling edge and HS_ON rising edge, or HS_ON falling edge and LS_ON rising edge are moving close to each other by 1-step of delay time. This process will be continued every cycle of signal IN unless NO pulse is generated on PP1/PP2.

As illustrated with labels "5" in FIG. 3, when there is no pulse generated for PP1 or PP2 at the transitions of LS_G/HS_G, delay counts DLY_1 or DLY_2 is increased by 1-step of delay time. As a result, either LS_ON falling edge and HS_ON rising edge, or HS_ON falling edge and LS_ON rising edge are moving away from each other by 1-step of delay time. This process will be continued every cycle of signal IN unless there is pulse generated on PP1/PP2.

Figure 4:
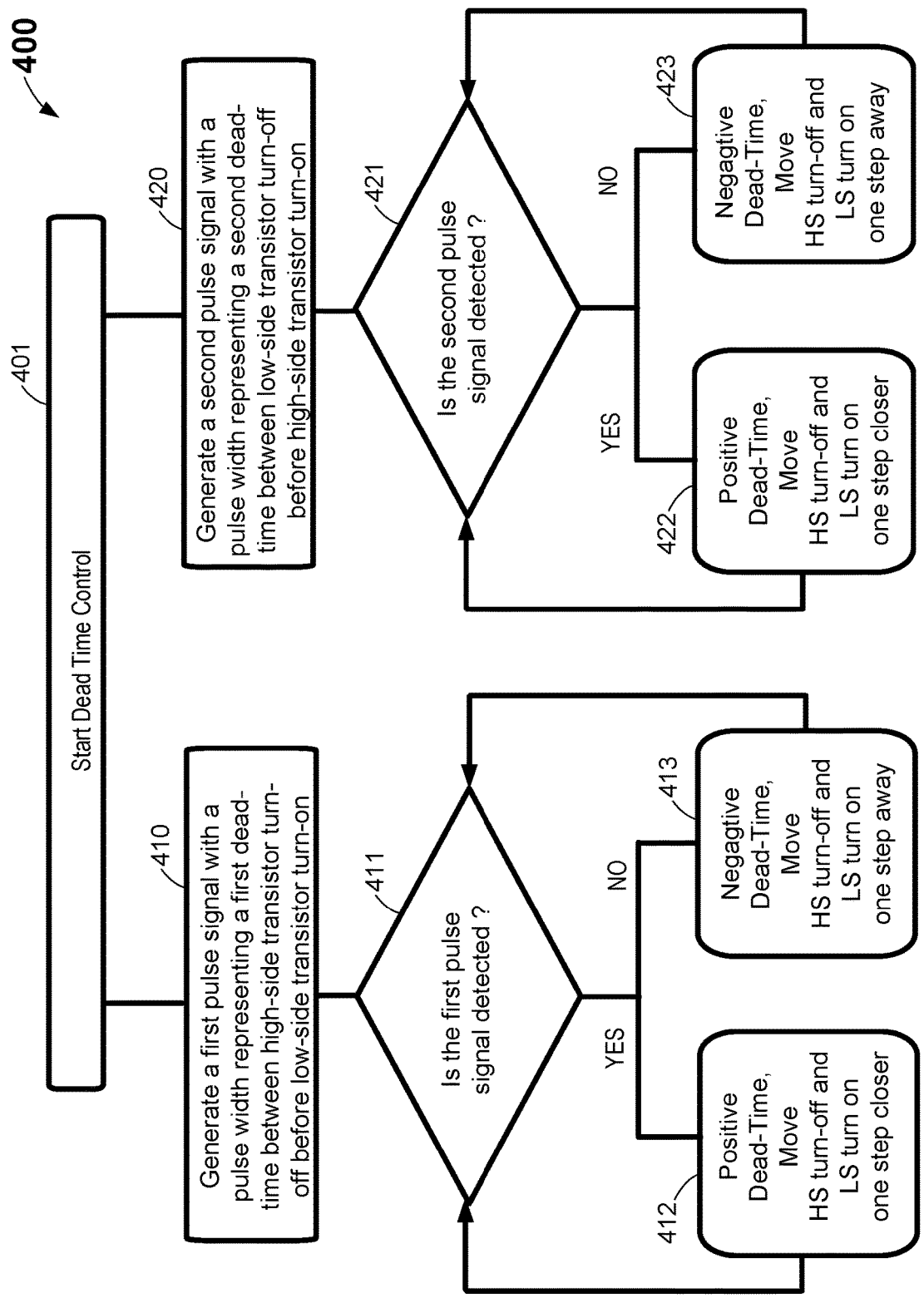
FIG. 4 is a flowchart that illustrates the operation of the gate driver circuit of FIG. 2 that embodies certain aspects of this invention.

FIG. 4 is a flowchart that illustrates a method for reducing the dead-time of the gate driver circuit of FIG. 2 that embodies certain aspects of this invention. As shown in FIG. 4, method 400 includes, at 401, starts the dead time control process. At 410, the method includes generating a first pulse signal with a pulse width representing a first dead-time between high-side transistor turn-off before low-side transistor turn-on. At 411, it is determined if the first pulse signal is detected. If the first pulse signal is detected, at 412, then it is determined that a positive first dead-time exists, and the high-side transistor turn-off and the low-side transistor turn-on are moved closer by one timing step to reduce the first dead-time. Otherwise, at 413, the first pulse signal is not detected, then it is determined that either no first dead-time or a negative first dead-time exists, and the high-side transistor turn-off and the low-side transistor turn-on are moved apart by one timing step to increase the first dead-time.

The above processes are also carried out for the second dead-time. At 420, the method includes generating a second pulse signal with a pulse width representing a second dead-time between low-side transistor turn-off before high-side transistor turn-on. At 421, it is determined if the first pulse signal is detected. If the first pulse signal is detected, at 422, then it is determined that a positive second dead-time exists, and the low-side transistor turn-off and the high-side transistor turn-on are moved closer by one timing step to reduce the second dead-time. Otherwise, at 423, the second pulse signal is not detected, then it is determined that either no second dead-time or a negative second dead-time exists, and the low-side transistor turn-off and the high-side transistor turn-on are moved apart by one timing step to increase the second dead-time. As an example, a circuit for implementing the above method is described below.

Figure 5:
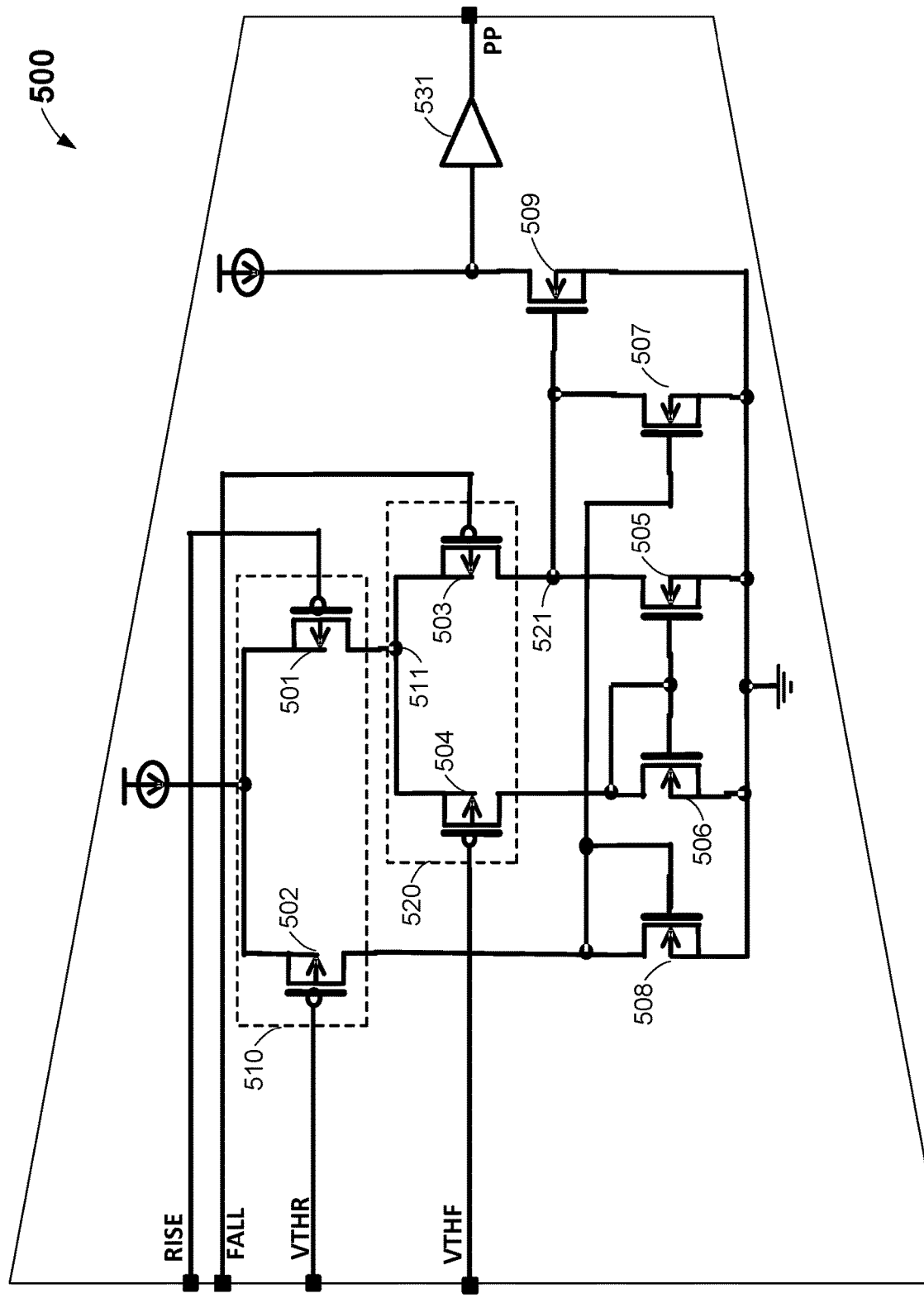
FIG. 5 is a schematic diagram illustrating a dead-time measurement circuit of FIG. 2 that embodies certain aspects of this invention.

FIG. 5 is a schematic diagram illustrating a dead-time measurement circuit of FIG. 2 that embodies certain aspects of this invention. FIG. 5 shows dead-time measurement circuit 500 is an example of circuit that can be used as the dead-time measurement circuits 211 and 212 in the gate driver circuit of FIG. 2. As illustrated in FIG. 5, dead-time measurement circuit 500 includes a first input terminal RISE for receiving a rising input signal, a second input terminal FALL for receiving a falling input signal, a first reference terminal VTHR for receiving a first reference voltage, a second reference terminal VTHF for receiving a second reference voltage. Dead-time measurement circuit 500 produces a pulse signal PP with a pulse width representing a dead-time between a first time instance when the falling input signal falls below the first reference voltage and a second time instance when the rising input signal rises above the second reference voltage.

As shown in FIG. 5, dead-time measurement circuit 500 includes a first differential pair 510 having first transistor 501 and second transistor 502. The first transistor 501 is coupled to the first input terminal RISE for receiving the rising input signal, and the second transistor 502 is coupled to the first reference terminal VTHR for receiving the first reference voltage. Dead-time measurement circuit 500 also includes a second differential pair 520 having third transistor 503 and fourth transistor 504. The third transistor 503 coupled to the second input terminal FALL for receiving the falling input signal, and the fourth transistor 504 is coupled to the second reference terminal VTHF for receiving a second reference voltage. In dead-time measurement circuit 500, the first differential pair 510 has an output node 511 at a drain node of the first transistor 501, and the second differential pair 520 has an output node 521 at a drain node of the third transistor. A common source node of the second differential pair 520 (i.e., the source nodes of transistors 503 and 504) is coupled to output node 511 of the first differential pair 510. The first and second differential pairs, 510 and 520 are coupled to a first current mirror formed by transistors 505 and 506 and a second current mirror formed by transistors 507 and 508. The pulse signal PP is derived from the output node 521 of the second differential pair 520, through a transistor 509 and an inverter 531. Pulse signal PP ha a pulse width representing a dead-time between a first time instance when the falling input signal falls below the first reference voltage and a second time instance when the rising input signal rises above the second reference voltage. In the example of FIG. 5, transistors 501, 502, 503, and 504 are PMOS transistors, and transistors 505-508 are NMOS transistor. In an alternative embodiments, the circuit can be implemented by interchanging the PMOS and NMOS transistors and reversing the polarities of the circuit.

Figure 6:
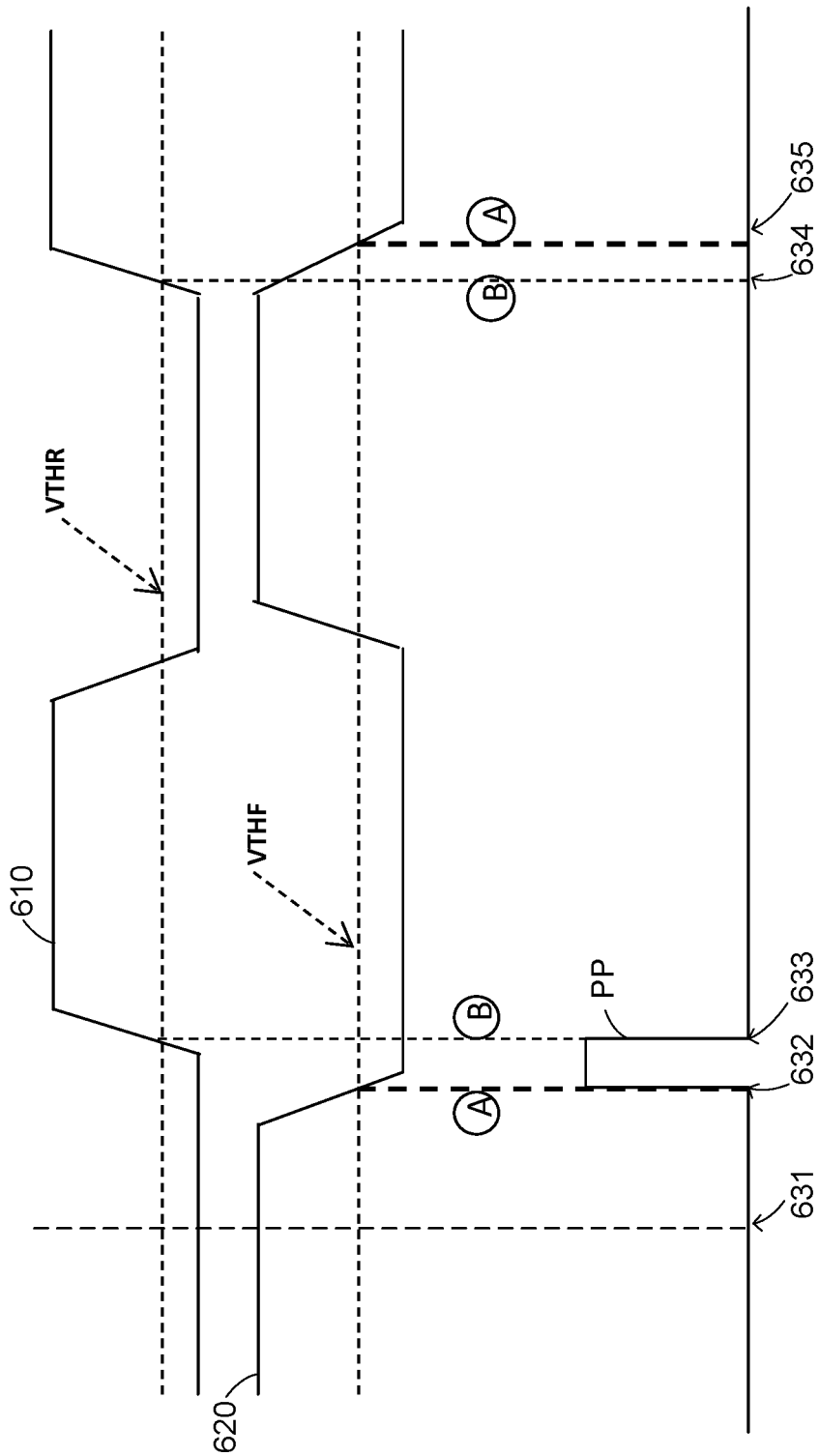
FIG. 6 is a timing diagram that illustrates the operation of the dead-time measurement circuit of FIG. 5 that embodies certain aspects of this invention.

FIG. 6 is a timing diagram that illustrates the operation of the dead-time measurement circuit of FIG. 5 that embodies certain aspects of this invention. In FIG. 6, the rising edges of waveform 610 is compared with reference voltage VTHR. For example, signal 610 can be the gate voltage of a first transistor, and reference voltage VTHR can be the threshold voltage of the first transistor. Similarly, the falling edges of signal 620 is compared with reference voltage VTHF. Waveform 610 can be the gate voltage of a second transistor, and reference voltage VTHF can be the threshold voltage of the second transistor. In some cases, reference voltages VTHR and VTHF can be the same threshold voltage for a transistor. As shown in FIG. 6, symbol "A" indicates the time instance 632 when the falling edge of signal 620 falls below threshold voltage VTHF, and symbol "B" indicates the time instance 633 when the rising edge of signal 610 rises above threshold voltage VTHR.

As described above, dead-time measurement 500 of FIG. 5 is a dual-pair input pulse generator, and it outputs a positive pulse PP when the voltages of both inputs signals RISE/FALSE are below their respective threshold voltages VTHR/VTHF. In other words, when time instance 632 (A) occurs before time instance 633 (B), the pulse signal PP is generated that represents a time duration between time instance "A" and time instance "B." On the other hand, when signal 620 falls after signal 610, i.e., when time instance 635 (A) occurs after time instance 634 (B), the pulse signal PP is not generated.

As described below, when applied to gate driver circuit 200 of FIG. 2, the pulse signal PP has a pulse width that represent a dead-time between the high-side transistor and the low-side transistor. Dead-time measurement circuit 500 of FIG. 5 is a fast circuit, as explained below. At time instance 631 in FIG. 6, signal 610 is below its threshold voltage VTHR, and signal 620 is above its threshold voltage VTHF. With reference to FIG. 5, transistor 501 is on, and transistor 503 is off. Further, transistors 504 and 505-506 are all on. Therefore, at time instance 632, signal 620 drops below threshold voltage VTHF to turn on transistor 503, thereby quickly triggering the start of pulse signal PP. Similarly, at time instance 633, when signal 610 rises above threshold voltage VTHR, turning off transistor 501, thereby terminating the pulse signal PP. Dead-time measurement 500 can generate the pulse signal PP that more accurately represents the duration of the dead-time, compared with conventional techniques. Further, dead-time measurement 500 can detect shorter dead-times and, thereby, allow further reduction of the dead-time. In the conventional dead-time detection circuits, logic operations involving two comparator circuits and additional logic circuits may be involved in determining the dead-time. The conventional circuit can be more complicated and have slower circuit speed, thereby limiting the extent to which the dead-time can be reduced.

Figure 7:
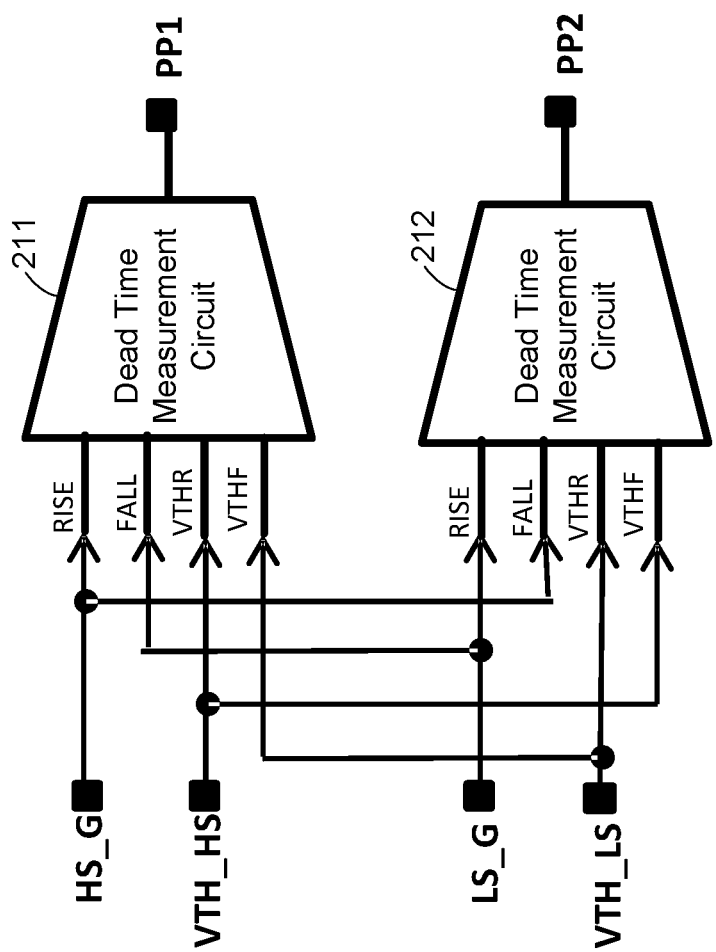
FIG. 7 is a simplified block diagram illustrating first and second dead-time measurement circuits in the gate driver circuit of FIG. 2 that embodies certain aspects of this invention.

FIG. 7 is a simplified block diagram illustrating first and second dead-time measurement circuits in the gate driver circuit of FIG. 2 that embodies certain aspects of this invention. FIG. 7 illustrates a portion of FIG. 2 showing first and second dead-time measurements circuit 211 and 212. The following description makes reference to the components in FIG. 2. As described above in connection to FIG. 5, each of the dead-time measurement circuits is a high speed dual-pair input pulse generator, and it outputs a positive pulse when voltages of both inputs signals RISE/FALSE are below their threshold voltages VTHR/VTHF. In FIG. 7, HS_G is the gate voltage of the high-side MOSFET, which is considered to be turned on when HS_G is higher than its threshold voltage VTH_HS. LS_G is the gate voltage of the low-side MOSFET, which is considered to be turned on when LS_G is higher than its threshold voltage VTH_LS. With the dead-time measurement circuits with input configuration showed in FIG. 7, the dead-time can be represented by a positive pulse on the output of the dead-time measurement circuit. The first dead-time measurement circuit 211 measures the dead-time between low-side MOSFET turn off before high-side MOSFET turn on. The second dead-time measurement circuit 212 measures the dead-time between high-side MOSFET turn off before low-side MOSFET turn on. In some cases, VTH_HS and VTH_LS can be the same if low-side and high-side MOSFETs are the same. As described below, the threshold voltages VTH_HS and VTH_LS can be generated using different means. For example, if the low-side and high-sided MOSFETs are on the same die with the gate driver, VTH_HS/VTH_LS can be matched with that of the MOSFET even under different operating conditions.

Figure 8:
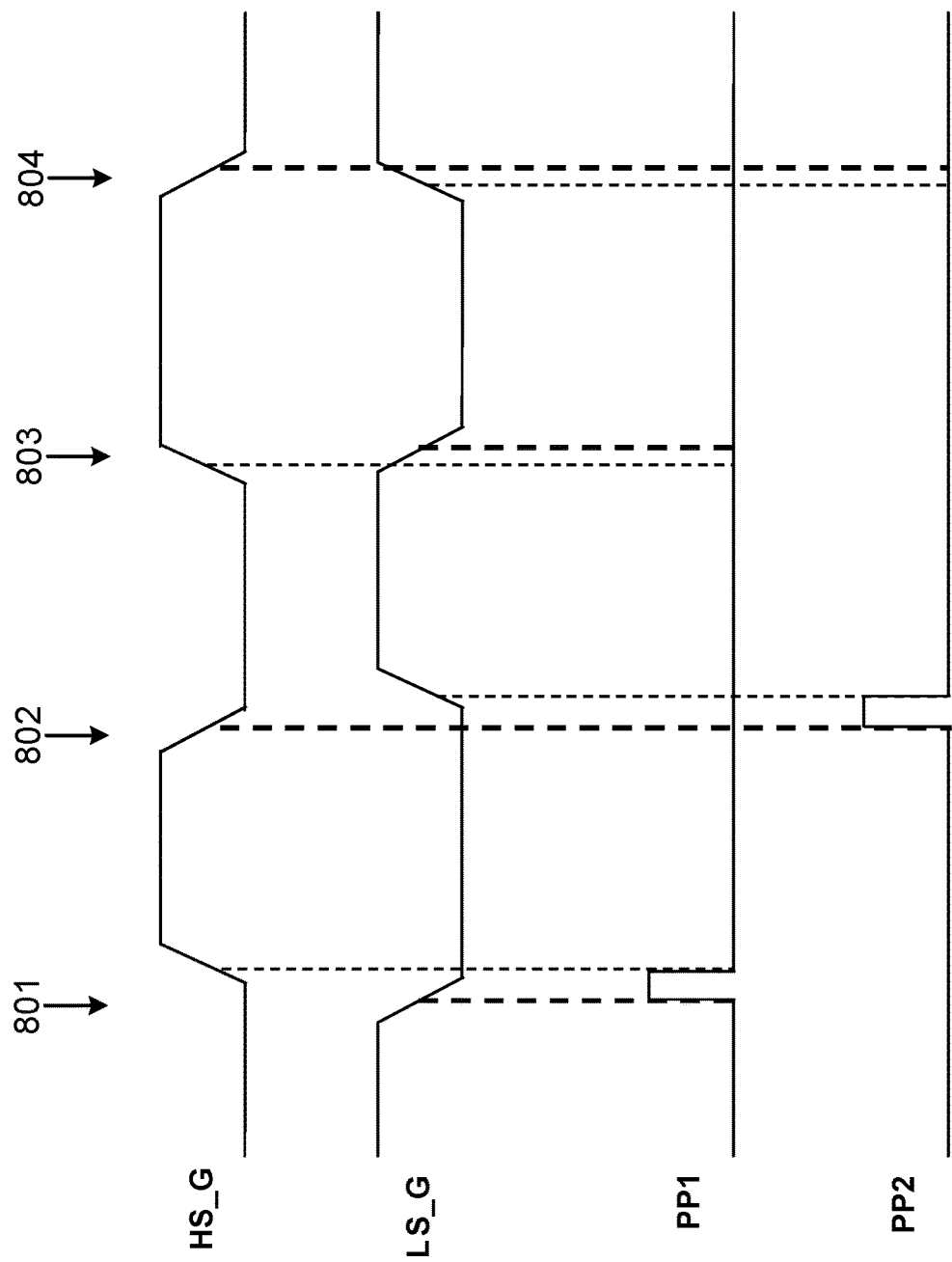
FIG. 8 is a timing diagram that illustrates the operation of the dead-time measurement circuits of FIG. 7 that embody certain aspects of this invention.

FIG. 8 is a timing diagram that illustrates the operation of the dead-time measurement circuits of FIG. 7 that embodies certain aspects of this invention. FIG. 8 is similar to FIG. 6, but refers to the gate voltages of the high-side transistor HS_G and low-side transistor LS_G in FIG. 2. FIG. 8 illustrates that a positive pulse signal is generated only when both the high-side and low-side transistors are off. Four examples are shown in FIG. 8. At 801, when the low-side transistor is turned off (shown by gate voltage LS_G) before the high-side transistor is turned on (shown by gate voltage HS_G), a positive pulse signal PP1 is generated and the pulse width of pulse signal PP1 represents the duration of the dead-time. Similarly, at 802, when the high-side transistor is turned off (shown by gate voltage HS_G) before the low-side transistor is turned on (shown by gate voltage LS_G), a positive pulse signal PP2 is generated and the pulse width of pulse signal PP1 represents the duration of the dead-time. In contrast, at 803, when the low-side transistor is turned off (shown by gate voltage LS_G) after the high-side transistor is turned on (shown by gate voltage HS_G), no pulse signal is generated. Similarly, at 804, when the high-side transistor is turned off (shown by gate voltage HS_G) after the low-side transistor is turned on (shown by gate voltage LS_G), no pulse signal is generated.

As described above in connection to FIG. 2, dead-time control circuit 200 includes a delay circuit 214 that provides a first delay count DLY_1 related to the first dead-time PP1 and a second delay count DLY_2 related to the second dead-time PP1. At every cycle of the input switching signal, delay circuit 214 decrements the first delay count DLY_1 if the first pulse signal PP1 is detected, and increments the first delay count DLY_1 if the first pulse signal PP1 is not detected. Further, delay circuit 214 decrements the second delay count DLY_2 if the second pulse signal PP2 is detected, and increments the second delay count DLY_2 if the second pulse signal PP2 is not detected. Delay circuit 214 also has a delay chain circuit DLY_CHAN for receiving the first delay count DLY_1 and the second delay count DLY_2 and providing a first gate control signal HS_ON and a second gate control signal LS_On based on the input switching signal IN and the first and second delay counts, DLY_1 and DLY_2.

Figure 9:
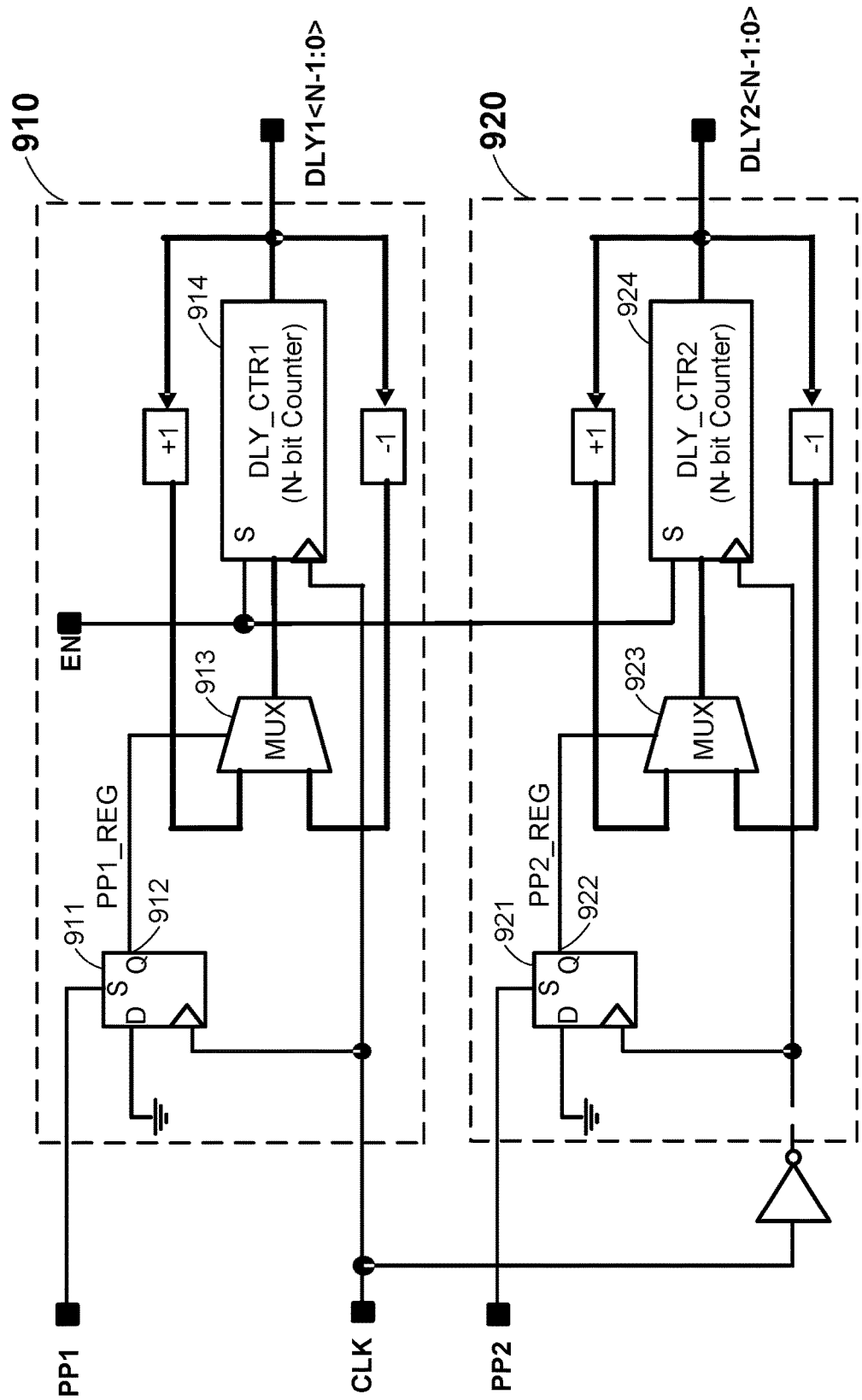
FIG. 9 is a simplified block diagram illustrating first and second delay counter circuits in the delay circuit of FIG. 2 that embodies certain aspects of this invention.

FIG. 9 is a simplified block diagram illustrating first and second delay counter circuits in the delay circuit of FIG. 2 that embodies certain aspects of this invention. As shown in FIG. 9, a first delay counter circuit 910 and a second delay counter circuit 920 are examples of delay counter circuits that can be used as the first delay counter circuit DLY_CNT_1 and the second delay counter circuit DLY_CNT_2 in FIG. 2. In FIG. 9, the first delay counter circuit 910 includes a first flip-flop 911 for providing a first trigger signal PP1_REG at an output node 912 in response to the first pulse signal PP1, a first N-bit counter 914 (DLY_CTR1) for providing the first delay count DLY1<N−1:0>, where N is an integer and the first delay count DLY1<N−1:0> is a N-bit count. The first delay counter circuit 910 also has a first multiplexer 913 coupled to the first N-bit counter 914 and the output node 912 of the first flip-flop 911 to cause the first N-bit counter 914 (DLY_CTR1) to either increment or decrement the first N-bit counter 914 by one count (as indicated by the +1 and −1 boxes) in response to the first trigger signal PP1_REG.

Similarly, the second delay counter circuit 920 includes a second flip-flop 921 for providing a second trigger signal PP2_REG at an output node 922 in response to the second pulse signal PP2, a second N-bit counter 924 (DLY_CTR2) for providing the second delay count DLY1<N−1:0>, where N is an integer and the second delay count DLY2<N−1:0> is a N-bit count. The second delay counter circuit 920 also has a second multiplexer 923 coupled to the second N-bit counter 924 (DLY_CTR2) and the output node 922 of the second flip-flop 921 to cause the second N-bit counter 924 to either increment or decrement the second N-bit counter 924 by one count (as indicated by the +1 and −1 boxes) in response to the first trigger signal PP2_REG.

In FIG. 9, each of the flip-flops 911 and 912 has data node D connected to a ground, a set node S coupled to the pulse signals PP1 or PP2, respectively, for triggering the flip-flop, and an output node Q. Each of the flip-flops 911 and 912 has a clock input node coupled to a clock signal CLK or an inverse of the clock signal CLK. Each of the flip-flops 911 and 912 can have a minimum pulse width for triggering. The minimum pulse width can be varied depending on the detailed circuit design of the flip-flop, and it determines the minimum dead-time duration that can be measured. In some embodiments, the minimum dead-time duration can be 1 nsec or less. Each of the N-bit counters 514 and 524 has a set node S coupled to an enable signal EN and a clock input node coupled to a clock signal CLK or an inverse of the clock signal CLK.

Figure 10:
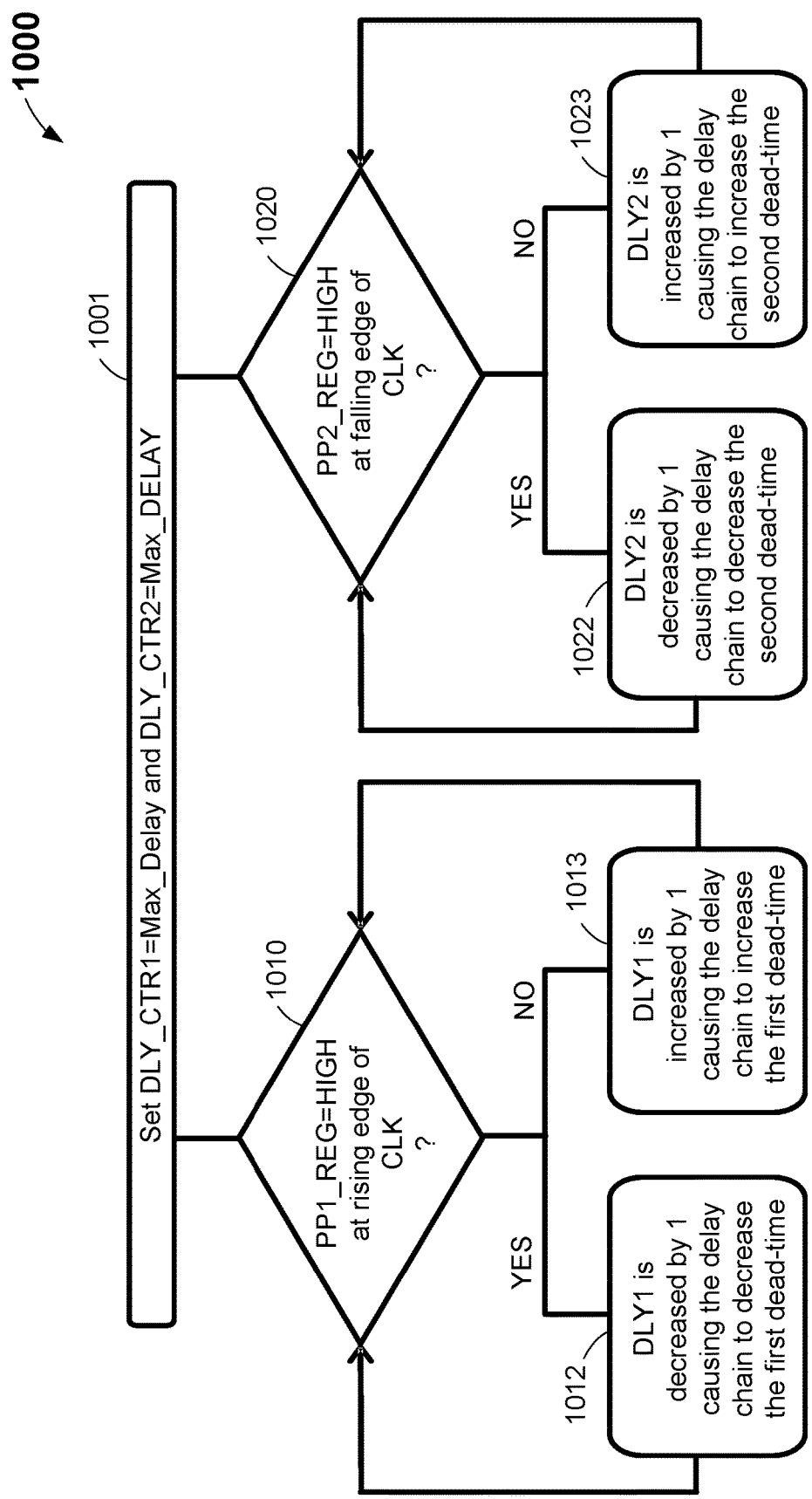
FIG. 10 is a flowchart that illustrates a method of operating the delay counter circuits in the dead-time measurement circuit of FIG. 2 that embodies certain aspects of this invention.

FIG. 10 is a flowchart that illustrates a method of operating the delay counter circuits in the dead-time measurement circuit of FIG. 2 that embodies certain aspects of this invention. As shown in FIG. 10, method 1000 includes, at 1001, set the count in the first N-bit counter DLY_CTR1 to Max_Delay and the count in the second N-bit counter DLY_CTR2 to Max_DELAY. Here, Max_Delay is a preset delay that can be determined by experiment or simulation. At 1010, determine if the output PP1_REG of the first flip-flop 911 is high at the rising edge of the clock signal CLK. If the output of the first flip-flop 911 is high, at 1012, indicating the first pulse signal is detected, then it is determined that a positive first dead-time is detected, and the counter causes the high-side transistor turn-off and the low-side transistor turn-on are moved closer by one timing step to reduce the first dead-time. Otherwise, at 1013, the output of the first flip-flop 911 is not high, indicating the first pulse signal PP1 is not detected, then it is determined that either no first dead-time or a negative first dead-time exists, and the high-side transistor turn-off and the low-side transistor turn-on are moved apart by one timing step to increase the first dead-time.

The above processes are also carried out for the second delay counter circuit. At 1020, determine if the output PP2_REG of the second flip-flop 912 is high at the falling edge of the clock signal CLK. If the output of the second flip-flop 921 is high, at 1022, indicating the second pulse signal PP2 is detected, then it is determined that a positive second dead-time is detected, and the high-side transistor turn-off and the low-side transistor turn-on are moved closer by one timing step to reduce the first dead-time. Otherwise, at 1023, the output of the second flip-flop 921 is not high, indicating the second pulse signal PP2 is not detected, then it is determined that either no first dead-time or a negative second dead-time exists, and the high-side transistor turn-off and the low-side transistor turn-on are moved apart by one timing step to increase the first dead-time.

In this example, counters DLY_CTR1 and DLY_CTR2 are designed as a N-bit counter that can count to $2^N$ steps. Non-inverted clock signal CLK for the counters is generated from input signal IN, which is also used to generate ON/OFF control signals for low-side and high-side MOSFETs. The input signal IN can be generated from a control circuit, for example, for PWM (pulse width modulation) control.

In each cycle of the clock signal or the input signal IN, a positive pulse of PP1 may or may not be generated after rising edge of CLK, and this information is stored and evaluated at the next rising edge of CLK. If stored PP1 is high, counter DLY_CTR1 is decreased by 1 to move then low-side turn OFF time and the high-side turn ON time close to each other by one-step of delay. This process continues and tends to decrease the dead-time and move the dead-time to zero. If stored PP1 is low, counter DLY_CTR1 is increased by 1 to move the low-side turning OFF time and the high-side turning ON time away from each other by one-step of delay. This process continues and tends to move the dead-time from being negative.

Similarly, in each cycle, positive pulse of PP2 may or may not be generated after falling edge of CLK, and this information is stored and evaluated at the next falling edge of CLK. If stored PP2 is high, DLY_CNT2 is decreased by 1 to move high-side turning OFF and low-side turning ON close to each other by one-step of delay. This process continues and tends to move the dead-time to zero. If stored PP1 is low, DLY_CNT2 is increased by 1 to move high-side turning OFF and low-side turning ON away from each other by one-step of delay. This process continues and tends to move the dead-time from being negative. A small fixed delay can be added in the design to guarantee the dead-time never be negative although the dead-time measurement circuit may see a small "negative" dead-time.

Figure 11:
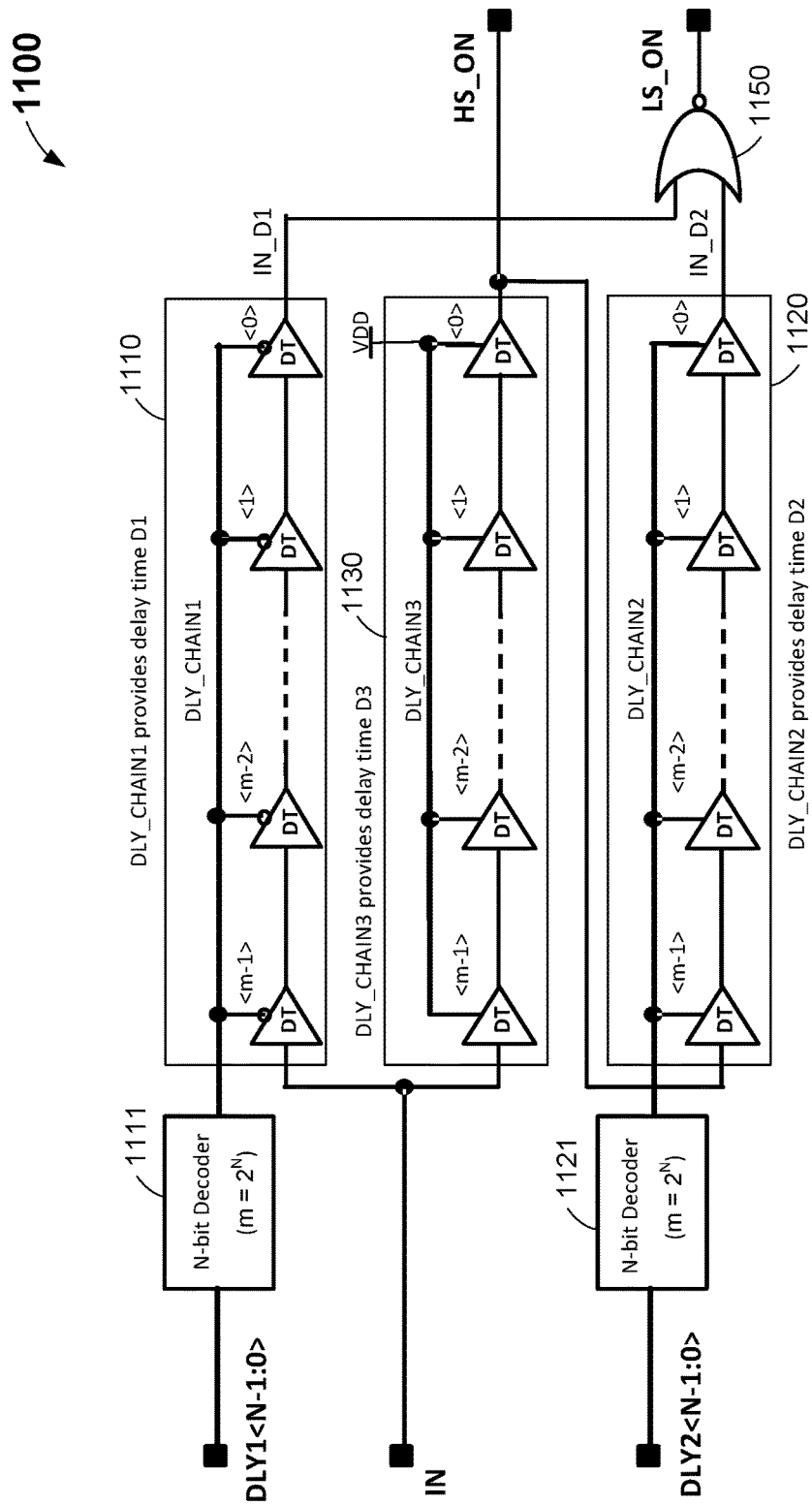
FIG. 11 is a simplified block diagram illustrating the delay chain circuit in the delay circuit of FIG. 2 that embodies certain aspects of this invention.

FIG. 11 is a simplified block diagram illustrating the delay chain circuit in the delay circuit of FIG. 2 that embodies certain aspects of this invention. As shown in FIG. 11, delay chain circuit 1100 includes a first delay chain 1110 (DLY_CHAIN1) for providing a first delay time D1, a second delay chain 1120 (DLY_CHAIN2) for providing a second delay time D2, a third delay chain 1130 (DLY_CHAIN3) for providing a fixed delay time D3, and a NOR gate 1150. The delay chain circuit 1100 provides the first gate control signal HS_ON based on the input switching signal IN and a fixed delay time D3. The delay chain circuit 1100 provides the second gate control signal LS_ON based on a NOR operation of first delayed input switching signal IN_D1 and the second delayed input switching signal IN_D2. As shown in FIG. 11, the first delayed input switching signal IN_D1 is based on the input switching signal IN and the first delay time D1, and the second delayed input switching signal IN_D2 is based on the input switching signal IN, the fixed delay time D3, and the second delay time D2.

As shown in FIG. 11, the first delay chain 1110 (DLY_CHAIN1) has m delay elements DT and provides a delay time D1 based on the first delay count DLY1<N−1:0>, where m is an integer and $m=2^N$. Each of the m delay elements DT is a unit delay cell selected by m control bits <m−1>, <m−2>, ..., <1>, and <0> generated by a first N-bit decoder 1111. Each delay element DT provides a delay time of Δt when selected, and a near zero delay when not selected. In the first delay chain 1110, inverted values of m control bits are applied to select the delay elements.

The second delay chain 1120 (DLY_CHAIN2) having m delay elements DT and configured to provide a delay time D2 based on the second delay count DLY2<N−1:0>, where m is an integer and $m=2^N$. Each of the m delay elements DT is a unit delay cell selected by m control bits <m−1>, <m−2>, ..., <1>, and <0> generated by a second N-bit decoder 1121. Each delay element DT provides a delay time of Δt when selected, and a near zero delay when not selected.

Delay chain circuit 1100 can also include a third delay chain 1130 (DLY_CHAIN3) having m delay elements DT and configured to provide a fixed delay time D3. In the example of FIG. 11, the fixed delay D3 is provided by m delay elements all selected by a voltage VDD. Depending on the application, a different number of delay elements can also be used to provide the fixed time delay.

Figure 12:
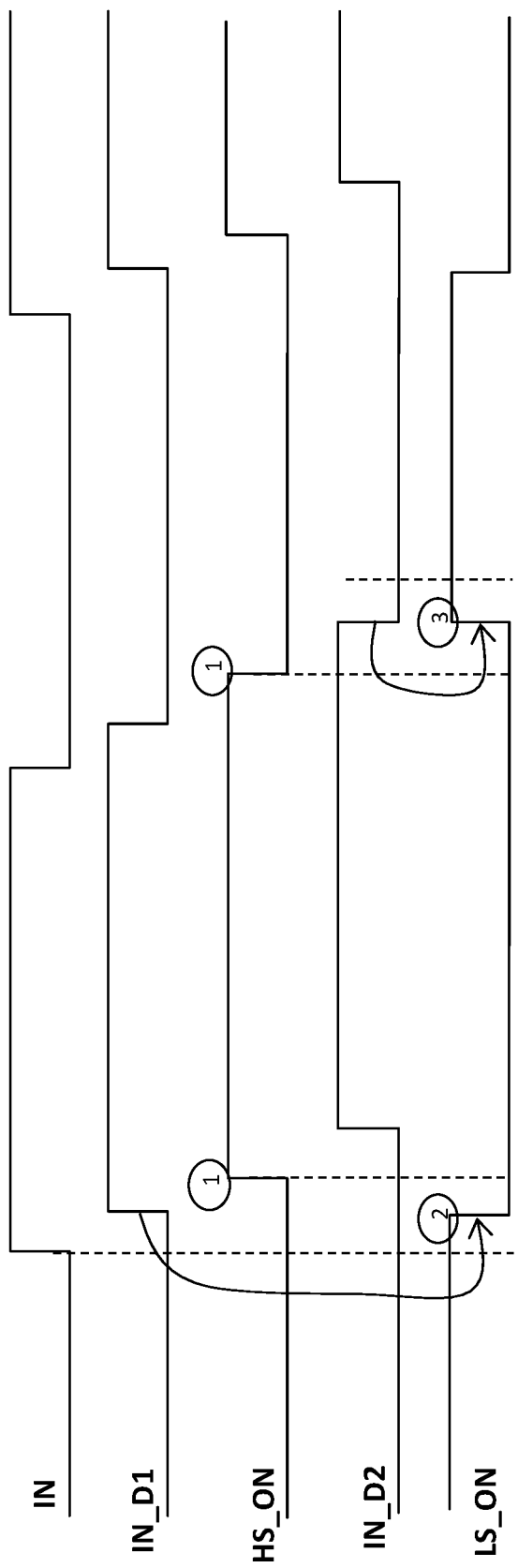
FIG. 12 is a timing diagram that illustrates the operation of the delay chain FIG. 11 that embodies certain aspects of this invention.

FIG. 12 is a timing diagram that illustrates the operation of the delay chain FIG. 11 that embodies certain aspects of this invention. In FIG. 12, waveforms of several signals in the delay chain 1100 in FIG. 11 are illustrated. For example, IN is the input switching signal IN, IN_D1 is the first delayed input switching signal, HS_ON is the first gate control signal, IN_D2 is the second delayed input switching signal, and LS_ON is the second gate control signal. In FIG. 12, the symbol "1" indicates that the HS_ON rising/falling edges are in a fixed delay D3 from the input switching signal IN, with the fixed day D3 defined by the third delay chain DLY_CHAIN3 in FIG. 11. The symbol "2" indicates that the falling edge of LS_ON is defined by the first delay D1 from the first delay chain DLY_CHAIN. The dead-time between the falling edge of LS_ON (at symbol "2") and the rising edge of HS_ON (at symbol "2") is (DLY1+1)*Δt, in which DLY1 can vary from 0 to $2^N-1$. The dead-time between the falling edge of HS_ON (at symbol "1") and the rising edge of LS_ON (at symbol "3") is (DLY2+1)*Δt, in which DLY2 can vary from 0 to $2^N-1$.

Figure 13:
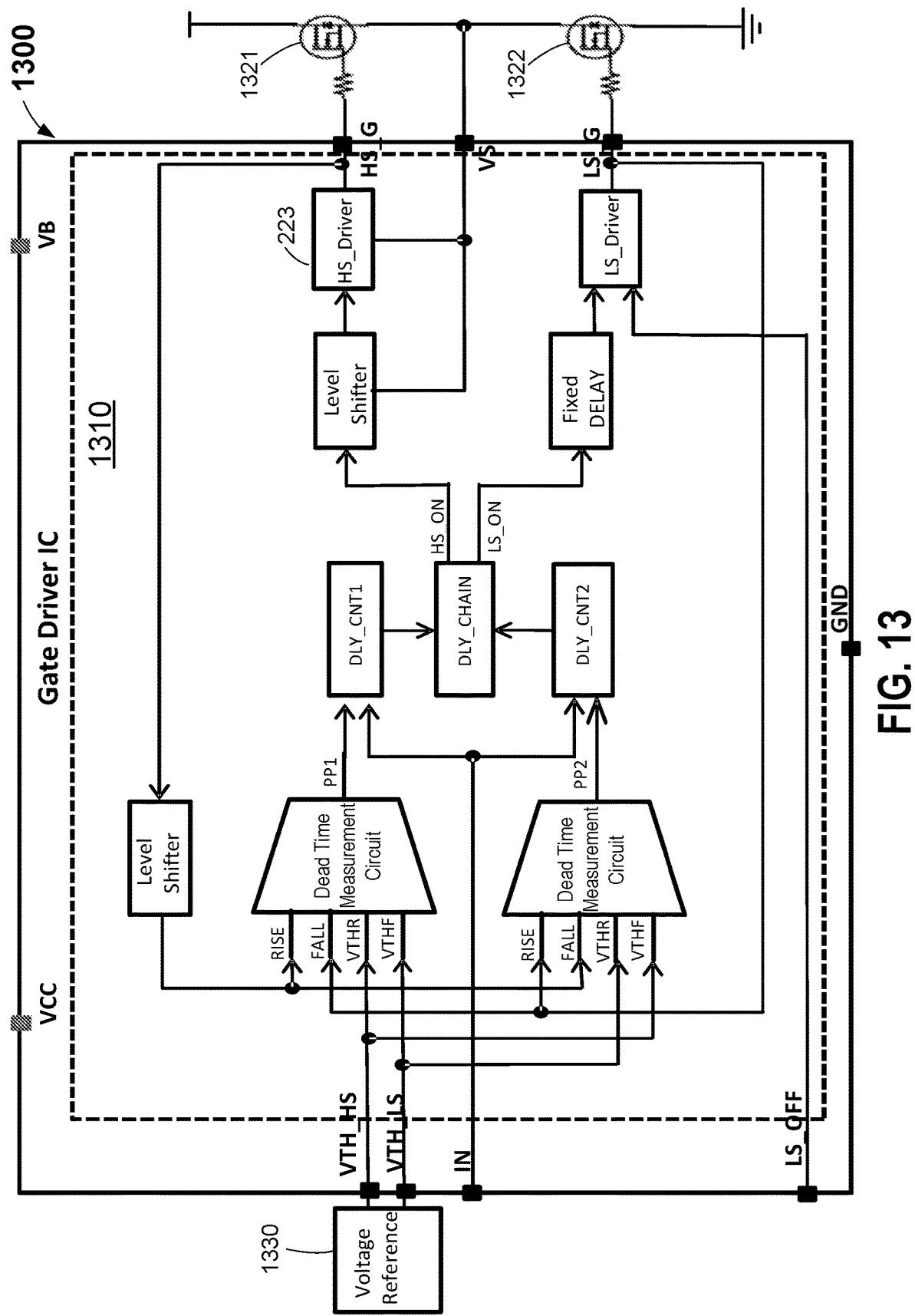
FIG. 13 is a simplified block diagram illustrating another gate driver circuit that embodies certain aspects of this invention.

FIG. 13 is a simplified block diagram illustrating another gate driver circuit that embodies certain aspects of this invention. FIG. 13 shows an integrated circuit 1300 including a gate driver circuit 1310. Gate driver circuit 1310 is similar to gate driver circuit 200 of FIG. 2. Therefore, the components and operation of gate driver circuit 1310 are not described here. Gate driver circuit 1310 is implemented on the single integrated circuit chip 1300. Integrated circuit 1300 has several terminals, for example, VCC, VB, HS_G, VS, LS_G, GND, LS_OFF, IN, VTH_HS, and VTH_LS. In FIG. 13, the high-side transistor 1321 and the low-side transistor 1322 are discrete components. Gate driver circuit 1310 receives reference threshold voltages VTHR and VTHF from an external voltage reference circuit 1330. The gate driver IC 1310, the high-side transistor 1321, the low-side transistor 1322, and the reference voltage circuit 1330 can all be built on the same PCB (printed circuit board).

Figure 14:
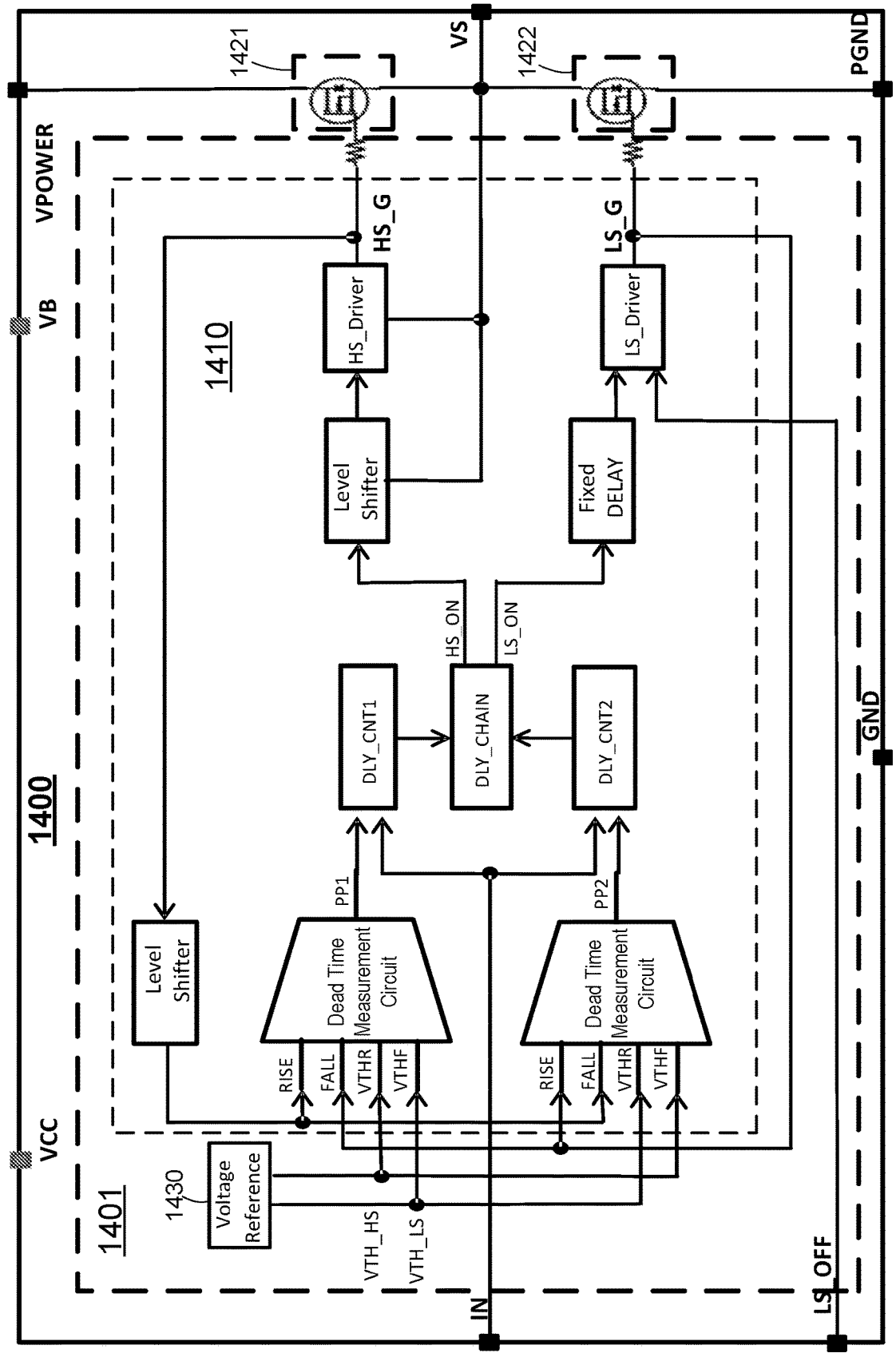
FIG. 14 is a simplified block diagram illustrating another gate driver circuit that embodies certain aspects of this invention.

FIG. 14 is a simplified block diagram illustrating another gate driver circuit that embodies certain aspects of this invention. FIG. 14 shows a co-package multi-chip module (MCM) 1400 that includes a gate driver circuit 1410 and reference voltage circuit 1430 in an integrated circuit 1401. A high-side transistor 1421 and the low-side transistor 1422 are can be implemented in their respective integrated circuit. Gate driver circuit 1410 is similar to gate driver circuit 200 of FIG. 2 and is implemented on a single integrated circuit chip. Gate driver circuit 1410 receives reference threshold voltages VTHR and VTHF from voltage reference circuit 1430 included in the same integrated circuit chip.

Co-package multi-chip module (MCM) 1400 has several terminals, for example, VCC, VB, VPOWER, VS, PGND, GND, LS_OFF, and IN. In this example, LS_OFF receives a signal to force LS MOSFET off, e.g. for DCM mode in the switching regulator. VB receives a boot-strap power supply for HS gate driver circuit. VPOWER is a power supply for the HS MOSFET. VS is a source terminal of HS MOSFET and a drain terminal of LS MOSFET being connected together, and it also serves as a virtual ground for HS gate driver circuit. PGND is a ground separated from GND, which is the ground for all internal circuits. PGND and GND are both connected to system ground on the PCB.

Figure 15:
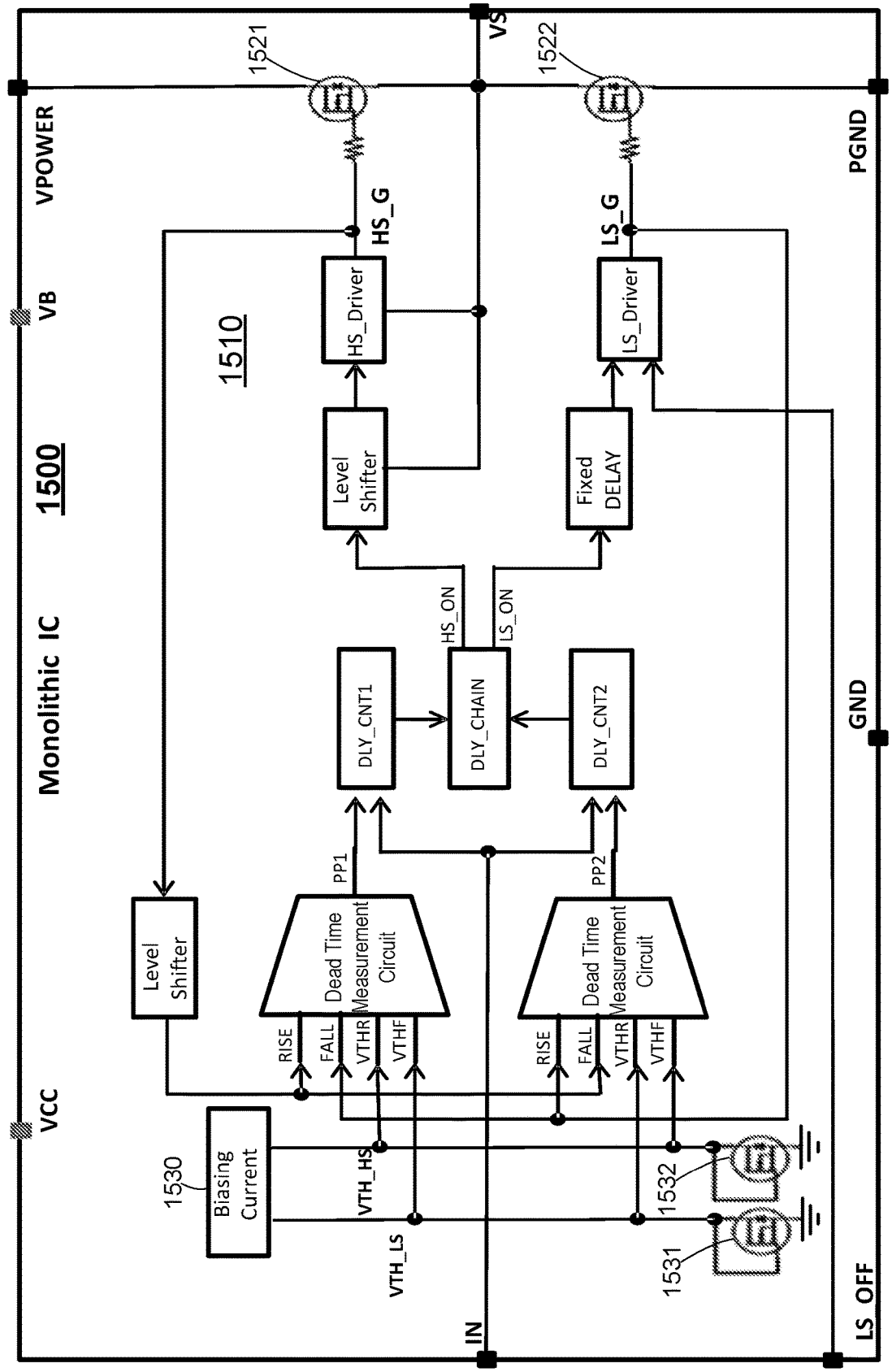
FIG. 15 is a simplified block diagram illustrating another gate driver circuit that embodies certain aspects of this invention.

FIG. 15 is a simplified block diagram illustrating another gate driver circuit that embodies certain aspects of this invention. FIG. 15 shows a monolithic integrated circuit (IC) 1500 including a gate driver circuit 1510. Gate driver circuit 1510 is similar to gate driver circuit 200 of FIG. 2. Therefore, the components and operation of gate driver circuit 1510 are not described here. In FIG. 15, the high-side transistor 1521 and the low-side transistor 1522 are integrated on the same integrated circuit 1500. Gate driver circuit 1510 receives reference threshold voltages VTH_HS and VTH_LS from two on-chip transistors 1531 and 1532 biased with a biasing current circuit 1530. Transistors 1531 and 1532 are fabricated on the same IC chip and can be matched to high-side transistor 1521 and low-side transistor 1522, respectively, to provide accurate threshold voltages that match the threshold voltages of high-side transistor 1521 and the low-side transistor 1522. In some cases, high-side transistor 1521 and the low-side transistor 1522 can be formed as multi-finger combed transistors, and transistors 1531 and 1532 can be formed using one of the fingers to sample to threshold voltage.

What is claimed is:

1. A gate driver circuit, comprising:
   an input terminal for receiving an input switching signal for driving a switching circuit having a high-side transistor and a low-side transistor vertically stacked;
   a first output terminal for providing a first output signal for driving the high-side transistor;
   a second output terminal for providing a second output signal for driving the low-side transistor;
   a dead-time control circuit, comprising:
      a first dead-time measurement circuit configured to produce a first pulse signal having a first pulse width representing a first dead-time between a first time instance when a gate voltage of the low-side transistor falls below a first threshold voltage and a second time instance when a gate voltage of the high-side transistor rises above a second threshold voltage;
      a second dead-time measurement circuit configured to produce a second pulse signal having a second pulse width representing a second dead-time between a third time instance when the gate voltage of the high-side transistor falls below the second threshold voltage and a fourth time instance when the gate voltage of the low-side transistor rises above the second threshold voltage; and
      a delay circuit configured to provide a first delay count related to the first dead-time and a second delay count related to the second dead-time, wherein, at every cycle of the input switching signal, the delay circuit is configured to:
         decrement the first delay count if the first pulse signal is detected, and increment the first delay count if the first pulse signal is not detected; and
         decrement the second delay count if the second pulse signal is detected, and increment the second delay count if the second pulse signal is not detected;
         wherein the delay circuit is configured to provide a first gate control signal and a second gate control signal based on the input switching signal and the first and second delay counts;
      and
   an output driver circuit configured to generate:
      the first output signal based on the first gate control signal; and
      the second output signal based on the second gate control signal.

2. The gate driver circuit of claim 1, wherein each of the first and second dead-time measurement circuits comprises:
   a first input terminal for receiving a rising input signal;
   a second input terminal for receiving a falling input signal;
   a first reference terminal for receiving the first threshold voltage;
   a second reference terminal for receiving the second threshold voltage;
   wherein each of the first and second dead-time measurement circuits is configured to produce a pulse signal with a pulse width representing a dead-time between a first time instance when the falling input signal falls below the first threshold voltage and a second time instance when the rising input signal rises above the second threshold voltage.

3. The gate driver circuit of claim 2, wherein each of the first and second dead-time measurement circuits further comprises:
   a first differential pair having first and second transistors, the first transistor coupled to the first input terminal for receiving the rising input signal and the second transistor coupled to the first reference terminal for receiving the first reference voltage, the first differential pair having an output node at a drain node of the first transistor; and
   a second differential pair having third and fourth transistors, the third transistor coupled to second input terminal for receiving the falling input signal and the fourth transistor coupled to the second reference terminal for receiving a second reference voltage, a common source node of the second differential pair coupled with the output node of the first differential pair, and the second differential pair having an output node at a drain node of the third transistor.

4. The gate driver circuit of claim 2,
wherein, in the first dead-time measurement circuit,
the first input terminal is coupled to a gate voltage of the high-side transistor;
the second reference terminal is coupled to a threshold voltage of the high-side transistor;
the second input terminal is coupled to a gate voltage of the low-side transistor; and
the second reference terminal is coupled to a threshold voltage of the low-side transistor;
wherein, in the second dead-time measurement circuit,
the first input terminal is coupled to a gate voltage of the low-side transistor;
the first reference terminal is coupled to a threshold voltage of the low-side transistor;
a gate voltage of the high-side transistor is coupled to the second input terminal; and
the second reference terminal is coupled to a threshold voltage of the high-side transistor.

5. The gate driver circuit of claim 1, wherein the delay circuit comprises:
a first delay counter circuit configured to provide the first delay count based on the first pulse signal;
a second delay counter circuit configured to provide the second delay count based on the second pulse signal; and
a delay chain circuit configured to receive the first and second delay counts and to provide the first and second gate control signals based on the input switching signal and the first and second delay counts.

6. The gate driver circuit of claim 5, wherein the first delay counter circuit comprises:
a first flip-flop for providing a first trigger signal in response to the first pulse signal;
a first N-bit counter for providing the first delay count, wherein N is an integer; and
a first multiplexer coupled to the first N-bit counter and an output of the first flip-flop to cause the first N-bit counter to increment or decrement the first N-bit counter in response to the first trigger signal.

7. The gate driver circuit of claim 5, wherein the second delay counter circuit comprises:
a second flip-flop for a second trigger signal in response to the second pulse signal;
a second N-bit counter for providing the second delay count, wherein N is an integer; and
a second multiplexer coupled to the second N-bit counter and an output of the second flip-flop to cause the second N-bit counter to increment or decrement the second N-bit counter in response to the second trigger signal.

8. The gate driver circuit of claim 7, wherein the delay chain circuit comprises:
a first delay chain having m delay elements and configured to provide a delay time based on the first delay count, where m is an integer and $m=2^N$;
a second delay chain having m delay elements and configured to provide the second delay time based on the second delay count; and
a NOR gate;

wherein the delay chain circuit is configured to provide:
the first gate control signal based on the input switching signal and a fixed delay time;
a first delayed input switching signal based on the input switching signal and the first delay time;
a second delayed input switching signal based on the input switching signal, the fixed delay time, and the second delay time; and
the second gate control signal based on a NOR operation of first delayed input switching signal and the second delayed input switching signal.

9. The gate driver circuit of claim 1, wherein the output driver circuit comprises:
a high-side driver; and
a low-side driver.

10. A gate driver circuit, comprising:
an input terminal for receiving an input switching signal for driving a switching circuit having a high-side transistor and a low-side transistor vertically stacked;
a first output terminal for providing a first output signal for driving the high-side transistor;
a second output terminal for providing a second output signal for driving the low-side transistor;
a dead-time control circuit, comprising:
a first dead-time measurement circuit configured to produce a first pulse signal having a first pulse width representing a first dead-time between a first time instance when a gate voltage of the low-side transistor falls below a first threshold voltage and a second time instance when a gate voltage of the high-side transistor rises above a second threshold voltage; and
a second dead-time measurement circuit configured to produce a second pulse signal having a second pulse width representing a second dead-time between a third time instance when the gate voltage of the high-side transistor falls below the second threshold voltage and a fourth time instance when the gate voltage of the low-side transistor rises above the second threshold voltage;
wherein the dead-time control circuit is configured to provide a first gate control signal and a second gate control signal based on the input switching signal and the first and second pulse signals; and
an output driver circuit configured to generate:
the first output signal based on the first gate control signal; and
the second output signal based on the second gate control signal.

11. The gate driver circuit of claim 10, wherein each of the first and second dead-time measurement circuits comprises:
a first input terminal for receiving a rising input signal;
a second input terminal for receiving a falling input signal;
a first reference terminal for receiving a first reference voltage;
a second reference terminal for receiving a second reference voltage;
wherein each of the first and second dead-time measurement circuits is configured to produce a pulse signal with a pulse width representing a dead-time between a first time instance when the falling input signal falls below the first reference voltage and a second time instance when the rising input signal rises above the second reference voltage.

12. The gate driver circuit of claim 11, wherein each of the first and second dead-time measurement circuits comprises:

a first differential pair having first and second transistors, the first transistor coupled to the first input terminal for receiving the rising input signal and the second transistor coupled to the first reference terminal for receiving the first reference voltage, the first differential pair having an output node at a drain node of the first transistor; and a second differential pair having third and fourth transistors, the third transistor coupled to second input terminal for receiving the falling input signal and the fourth transistor coupled to the second reference terminal for receiving a second reference voltage, a common source node of the second differential pair coupled the output node of the first differential pair, and the second differential pair having an output node at a drain node of the third transistor.

13. The gate driver circuit of claim 10, wherein the dead-time control circuit further comprises:

a delay circuit configured to provide a first delay count related to the first dead-time and a second delay count related to the second dead-time, wherein, at every cycle of the input switching signal, the delay circuit is configured to:

decrement the first delay count if the first pulse signal is detected, and increment the first delay count if the first pulse signal is not detected; and decrement the second delay count if the second pulse signal is detected, and increment the second delay time if the second pulse signal is not detected;

wherein the delay circuit is configured to provide first and second gate control signals based on the input switching signal and the first and second delay counts.

14. The gate driver circuit of claim 13, wherein the delay circuit comprises:

a first delay counter circuit, which includes a first flip-flop for providing a first trigger signal in response to the first pulse signal, the first trigger signal configured to cause the first delay counter circuit to increment or decrement the first delay count; and a second delay counter circuit, which includes a second flip-flop for providing a second trigger signal in response to the second pulse signal, the second trigger signal configured to cause the second delay counter circuit to increment or decrement the second delay count.

15. A dead-time measurement circuit, comprising:

a first input terminal for receiving a rising input signal;

a second input terminal for receiving a falling input signal;

a first reference terminal for receiving a first reference voltage;

a second reference terminal for receiving a second reference voltage;

wherein the dead-time measurement circuit is configured to produce a pulse signal with a pulse width representing a dead-time between a first time instance when the falling input signal falls below the first reference voltage and a second time instance when the rising input signal rises above the second reference voltage.

16. The dead-time measurement circuit of claim 15, further comprising:

a first differential pair having first and second transistors, the first transistor coupled to the first input terminal for receiving the rising input signal and the second transistor coupled to the first reference terminal for receiving the first reference voltage, the first differential pair having an output node at a drain node of the first transistor; and a second differential pair having third and fourth transistors, the third transistor coupled to second input terminal for receiving the falling input signal and the fourth transistor coupled to the second reference terminal for receiving a second reference voltage, a common source node of the second differential pair coupled the output node of the first differential pair, and the second differential pair having an output node at a drain node of the third transistor.

17. The dead-time measurement circuit of claim 16, further comprising a second current mirror coupled to an output of the second differential pair and the second transistor.

18. The dead-time measurement circuit of claim 17, further comprising:

an output transistor with a gate coupled to the output of the second differential pair; and an inverter coupled to a drain of the output transistor to provide the pulse signal.

19. The dead-time measurement circuit of claim 18, wherein:

the first current mirror comprises first and second NMOS transistors;

the second current mirror comprises third and fourth NMOS transistors; and the output transistor comprises a fifth NMOS transistor.

20. The dead-time measurement circuit of claim 16, wherein:

the first differential pair comprises first and second PMOS transistors; and the second differential pair comprises third and fourth PMOS transistors.

* * * * *